(12) United States Patent
Murata et al.

(10) Patent No.: US 6,194,523 B1
(45) Date of Patent: Feb. 27, 2001

(54) ADHESIVE RESIN COMPOSITION AND ADHESIVE FILM

(75) Inventors: Masaki Murata; Takahiro Hattori; Katsuya Emoto, all of Ohtsu (JP)

(73) Assignee: Toyo Boseki Kabushiki Kaisha, Osaka (JP)

( * ) Notice: Under 35 U.S.C. 154(b), the term of this patent shall be extended for 0 days.

(21) Appl. No.: 09/175,443

(22) Filed: Oct. 20, 1998

(30) Foreign Application Priority Data

Oct. 20, 1997 (JP) .................................................. 9-287112

(51) Int. Cl.⁷ ........................... C08G 65/32; C08L 71/02; C08L 67/00; C08L 77/00; C08F 20/00
(52) U.S. Cl. .................... 525/438; 525/403; 525/408; 525/440; 525/454
(58) Field of Search ........................... 525/403, 408, 525/438, 440, 454

(56) References Cited

U.S. PATENT DOCUMENTS

| | | | |
|---|---|---|---|
| 3,170,833 | 2/1965 | Noyes | 161/186 |
| 3,663,652 | 5/1972 | Cannon et al. | 260/830 |
| 4,267,288 | 5/1981 | Burkhart et al. | 525/438 |
| 5,122,552 | 6/1992 | Johnson | 523/454 |

FOREIGN PATENT DOCUMENTS

| | | |
|---|---|---|
| 317 185 | 5/1989 | (EP) . |
| WO 93/20123 | 10/1993 | (WO) . |

*Primary Examiner*—Patrick D. Niland
(74) *Attorney, Agent, or Firm*—Foley & Lardner

(57) ABSTRACT

An adhesive resin composition comprising polyester polyurethane having a number average molecular weight of 8,000–100,000 and an epoxy resin having two or more epoxy groups per molecule, said polyester polyurethane having an acid value of 100–1,000 equivalent/$10^6$ g and the proportion of polyester polyurethane having a molecular weight of not more than 5,000 is not more than 20 wt % and an adhesive film obtained from the adhesive resin composition. The adhesive resin composition and the adhesive film of the present invention have a longer working life and are superior in adhesive property, heat resistance and water resistance.

8 Claims, No Drawings

ADHESIVE RESIN COMPOSITION AND ADHESIVE FILM

TECHNICAL FIELD OF THE INVENTION

The present invention relates to an adhesive resin composition and an adhesive film. More particularly, the present invention relates to an adhesive resin composition and an adhesive film that maintain thermoplastic property at normal temperature, thereby permitting molding and processing, and that undergo rapid curing at a temperature beyond a certain temperature to afford superior heat resistance and superior water resistance.

BACKGROUND OF THE INVENTION

Various thermoplastic resins have been used in a broad range of fields in recent years. Thermoplastic resins are superior in solubility in solvents and heat seal property, but inferior in heat resistance. For an improved heat resistance, a two-part adhesive comprising a thermoplastic resin and a curing agent has been used. However, a two-part adhesive has a limited working life (pot life). To provide an adhesive resin composition having relatively long pot life and capable of thermosetting, an epoxy resin as a main component and other ingredients are used in various combinations. For example, such combinations are used as an adhesive for circuit board. The adhesive for this use is required to have not only adhesive property but also superior heat resistance, chemical resistance, flexibility, electric insulating property and the like. Heretofore, poly(vinyl butyral) resin-epoxy resin type adhesive compositions, acrylonitrile-butadiene rubber-epoxy resin type adhesive compositions and adhesive compositions comprising phenol resin or acrylic rubber as a main component have been widely used. However, poly(vinyl butyral) resin-epoxy resin type adhesive compositions are inferior in the most desired adhesive property and other adhesive compositions mentioned above are inferior in heat resistance.

In case of a copper clad laminate for print circuit, the portion of the copper foil to form a conductive part that is other than the circuit part is chemically etched to give a wire board and the circuit board is perforated so that terminals for connection to electric parts can be formed. During this process, it is required that the board be free of blister when it is immersed in a molten solder bath (chemical resistance), and an adhesive film be free of peeling off when the chemical used for soldering is washed away with water (water resistance).

The adhesive composition for the above-mentioned use is required to have relatively long working life and superior properties of heat resistance, chemical resistance, flexibility, electrical insulating property and the like, besides adhesive property. Conventional adhesive compositions for use heretofore that contain a thermoplastic resin have insufficient heat resistance, and those containing a thermosetting resin have insufficient flexibility and shorter working life (pot life).

SUMMARY OF THE INVENTION

It is therefore an object of the present invention to provide an adhesive resin composition superior in heat resistance and water resistance. The present invention now provides an adhesive resin composition comprising an epoxy resin and a polyester polyurethane containing less amount of a low molecular weight component in combination, and an adhesive film obtained from said adhesive resin composition.

Accordingly, the present invention provides the following.

(1) An adhesive resin composition comprising a polyester polyurethane having a number average molecular weight of 8,000–100,000 and an epoxy resin having two or more epoxy groups per molecule, said polyester polyurethane having an acid value of 100–1,000 equivalent/$10^6$ g and the proportion of polyester polyurethane having a molecular weight of not more than 5,000 being not more than 20 wt %.

(2) The adhesive resin composition of (1) above, wherein the polyester polyurethane comprises a polyester polyol component having a number average molecular weight of 5,000–50,000 in a proportion of not less than 60 wt %.

(3) The adhesive resin composition of (2) above, wherein the polyester polyol component comprises a dicarboxylic acid component comprising an aromatic dicarboxylic acid in a proportion of not less than 30 mol %.

(4) The adhesive resin composition of (1) above, wherein the polyester polyurethane comprises a polyester polyol comprising, as a constituent component, at least one dicarboxylic acid selected from the group consisting of terephthalic acid, isophthalic acid, phthalic acid, 2,6-naphthalenedicarboxylic acid and adipic acid.

(5) The adhesive resin composition of (1) above, wherein the polyester polyurethane comprises a polyester polyol comprising, as a constituent component, at least one glycol selected from the group consisting of ethylene glycol, propylene glycol, 2-methyl-1,3-propanediol, diethylene glycol, neopentyl glycol and 1,4-cyclohexanedimethanol.

(6) The adhesive resin composition of (1) above, wherein the polyester polyurethane comprises, as a constituent component, at least one organic diisocyanate selected from the group consisting of 4,4'-diphenylmethane diisocyanate, hexamethylene diisocyanate and isophorone diisocyanate.

(7) The adhesive resin composition of (1) above, having an equivalent ratio of (the carboxyl group contained in the polyester polyurethane):(the epoxy group contained in the epoxy resin) of 1:0.5–1:5.

(8) An adhesive film obtained from the adhesive resin composition of (1) above.

DETAILED DESCRIPTION OF THE INVENTION

The present invention provides an adhesive resin composition and an adhesive film superior in adhesive property, heat resistance and water resistance, which have a long working life due to the use of polyester polyurethane comprising a less amount of a low molecular weight component.

The polyester polyurethane to bee used in the present invention preferably has a number average molecular weight of from 8,000 to 100,000. It is preferable that polyester polyurethane having a molecular weight of not more than 5,000 be contained in a proportion of not more than 20 wt % of the entire polyester polyurethane. When the proportion of polyester polyurethane having a molecular weight of not more than 5,000 exceeds 20 wt %, curing proceeds even an normal temperature, thus necessitating low temperature storage and consumption in a short period of time, and heat resistance after curing becomes poor.

The polyester polyurethane to be used in the present invention comprises a polyester polyol component and an organic diisocyanate component, wherein the polyester polyol comprises a dicarboxylic acid component and a glycol component. It is particularly preferable for superior adhesive property and heat resistance that not less than 30 mol % of the dicarboxylic acid component be an aromatic dicarboxylic acid and not less than 60 wt % of polyester polyurethane be a polyester polyol component having a number average molecular weight of 5,000–50,000.

Polyester Polyol Component

The polyester polyol component to be used in the present invention comprises a dicarboxylic acid component and a glycol component. Where necessary, a polyvalent carboxylic acid having a valence of 3 or more and/or a polyhydric alcohol having a valence of 3 or more may be added as a branch agent. The dicarboxylic acid component to be used in the present invention preferably contains an aromatic dicarboxylic acid in not less than 30 mol %. When it is less than 30 mol %, water resistance and heat resistance are degraded. The number average molecular weight of the polyester polyol component is preferably 5,000–50,000.

The dicarboxylic acid component constituting the polyester polyol to be used in the present invention is exemplified by aromatic dicarboxylic acids such as terephthalic acid, isophthalic acid, phthalic acid, 1,5-naphthalenedicarboxylic acid, 2,6-naphthalenedicarboxylic acid, 4,4'-biphenyldicarboxylic acid, 2,2'-biphenyldicarboxylic acid, 4,4'-diphenyl ether dicarboxylic acid and the like, and aliphatic and alicyclic dicarboxylic acids such as adipic acid, azelaic acid, sebacic acid, 1,4-cyclohexanedicarboxylic acid, 1,3-cyclohexanedicarboxylic acid, 1,2-cyclohexanedicarboxylic acid, 4-methyl-1,2-cyclohexanedicarboxylic acid, dimer acid and the like, with particular preference given to terephthalic acid, isophthalic acid, phthalic acid, 2,6-naphthalenedicarboxylic acid and adipic acid. There dicarboxylic acids may be used alone or in combination.

The glycol component constituting the polyester polyol to be used in the present invention is exemplified by ethylene glycol, propylene glycol, 1,3-propanediol, 2-methyl-1,3-propanediol, 1,2-butanediol, 1,3-butanediol, 1,4-butanediol, 1,5-pentanediol, 1,6-hexanediol, 3-methyl-1,5-pentanediol, neopentyl glycol, diethylene glycol, dipropylene glycol, 2,2,4-trimethyl-1,3-pentanediol, 1,4-cyclohexanedimethanol, 3-hydroxy-2,2-dimethylpropyl 3-hydroxy-2,2-dimethylpropionate, addition product of bisphenol A with ethylene oxide or propylene oxide, addition product of hydrogenated bisphenol A with ethylene oxide or propylene oxide, 1,9-nonanediol, 2-methyl-1,8-octanediol, 1,10-dodecanediol, 2-butyl-2-ethyl-1,3-propanediol, tricyclo[3.3.1.1$^{3,7}$]decanedimethanol and the like, with preference given to ethylene glycol, propylene glycol, 2-methyl-1,3-propanediol, diethylene glycol, neopentyl glycol and 1,4-cyclohexanedimethanol. These glycol components may be used alone or in combination.

Examples of the polyvalent carboxylic acid having a valence of 3 or more to be used in the present invention include trimellitic acid, pyromellitic acid, benzophenonetetracarboxylic acid, anhydrides thereof, trimesic acid, ethylene glycol bis (anhydrotrimellitate), glycerol tris (anhydrotrimellitate) and the like, which may be used alone or in combination. The total amount of use of the aforementioned polyvalent carboxylic acid having a valence of 3 or more is 0–10 mol %, preferably 0–5 mol %, more preferably 0–3 mol %, of the dicarboxylic acid component used in the present invention. When it exceeds 10 mol %, adhesive property and mechanical property may be degraded.

The polyhydric alcohol having a valence of 3 or more to be used in the present invention may be, for example, glycerol, trimethylol propane or pentaerythritol, which may be used alone or in combination. The total amount of use of the aforementioned polyhydric alcohol having a valence of 3 or more is 0–10 mol %, preferably 0–5 mol %, and more preferably 0–3 mol % of the glycol component to be used in the present invention. When it exceeds 10 mol %, the adhesive property and mechanical property tend to be degraded.

In the present invention, a polyester polyol having a carboxyl group may be used. The carboxyl group is introduced into the polyester polyol by a method wherein the aforementioned polyvalent carboxylic acid is charged in excess over or in a nearly equivalent amount to the abovementioned polyhydric alcohol when polymerizing polyester polyol, followed by condensation polymerization, or a method wherein, after polymerization of polyester polyol, terminal hydroxy group is acid-modified (ring opening addition) with anhydrous polyvalent carboxylic acid and the like. The latter method is preferable since the amount added of the carboxyl group and the amount of terminal hydroxyl group can be controlled easily. Examples of said anhydrous polyvalent carboxylic acid include anhydrous phthalic acid, anhydrous trimellitic acid, anhydrous pyromellitic acid, anhydrous benzophenonetetracarboxylic acid, anhydrous succinic acid, anhydrous maleic acid, anhydrous hexahydrophthalic acid and anhydrous tetrahydrophthalic acid, with preference given to anhydrous phthalic acid and anhydrous trimellitic acid. These anhydrous polyvalent carboxylic acids may be used alone or in combination.

Polyester Polyurethane

The polyester polyurethane to be used in the present invention comprises a polyester polyol component and an organic diisocyanate component. The polyester polyol component is contained in a proportion of not less than 60 wt % of the polyester polyurethane.

The carboxyl group content (acid value) of polyester polyurethane is preferably within the range of 100–1,000 equivalent (eq)/$10^6$ g (ton). When polyester polyurethane has an acid value of less than 100 equivalent/$10^6$ g, the effect of the present invention cannot be exerted, whereas when polyester polyurethane has an acid value exceeding 1,000 equivalent/$10^6$ g, curing proceeds at normal temperature, thus necessitating low temperature storage and use in a short period of time.

The carboxyl group can be introduced into the polyester polyurethane to be used in the present invention by a method wherein a polyester polyol having a carboxyl group is synthesized by the aforementioned method and the resulting polyester polyol is used as a starting compound, or a method wherein a carboxyl group-containing diol compound, such as 2,2-dimethylolpropinic acid and 2,2-dimethylolbutanoic acid, is used as one component of the polyhydric alcohol to be used as a chain extender.

The organic diisocyanate component constituting the polyester polyurethane to be used in the present invention may be, for example, 2,4-tolylene diisocyanate, 2,6-tolylene diisocyanate, p-phenylene diisocyanate, 4,4'-diphenylmethane diisocyanate, m-phenylene diisocyanate, hexamethylene diisocyanate, tetramethylene diisocyanate, 3,3'-dimethoxy-4,4'-biphenylene diisocyanate, 1,5-naphthalene diisocyanate, 2,6-naphthalene diisocyanate, 3,3'-dimethyl-4,4'-diphenylmethane diisocyanate, 4,4'-diisocyanatodiphenyl ether, 1,5-xylylene diisocyanate, 1,3-diisocyanatomethylcyclohexane, 1,4-diisocyanatomethylcyclohexane, 4,4'-diisocyanatodicyclohexyl, 4,4'- diisocyanatodicyclohexylmethane, isophorone diisocyanate and the like, with preference given to 4,4'-diphenyl-methane diisocyanate, hexamethylene diisocyanate and isophorone diisocyanate.

The chain extender to be used in the reaction of an organic diisocyanate component and a polyester polyol component is exemplified by polyhydric alcohols such as ethylene glycol, propylene glycol, 1,3-propanediol, 1,4-butanediol, neopentyl glycol, 2,2-diethyl-1,3-propanediol, 2-butyl-2-ethyl-1,3-propanediol, 2,2-dibutyl-1,3-propanediol, 2-ethyl-2-hexyl-1,3-propanediol, 2,2-dihexyl-1,3- propanediol, 2-ethyl-2-isobutyl-1,3-propanediol, 2-methyl-1,3-propanediol, 1,5 -pentanediol, 1,6-hexanediol, 3-methyl-1,5-pentanediol, 3-ethyl-1,5-pentanediol, 3-propyl-1,5-pentanediol, 3-methyl-1,6-hexanediol, 4-methyl-1,7- heptanediol, 1,9-nonanediol, 1,8-nonanediol, 4-methyl-1,8-octanediol, 4-propyl-1,8-octanediol, diethylene glycol, triethylene glycol, glyercol, trimethylol ethane, trimethylol propane, mannitol, sorbitol, pentaerythritol, addition product of bisphenol A with alkylene oxide, addition product of bisphenol S with alkylene oxide, addition product of bisphenol F with alkylene oxide and xylene glycol, with preference given to neopentyl glycol, 1,6-hexanediol and 3-methyl-1,5-pentanediol. These polyhydric alcohols can be used alone or in combination as a chain extender.

Composition Containing Polyester Polyurethane and Epoxy Resin as Main Components The composition to be used in the present invention, which contains polyester polyurethane and epoxy resin as main components, may also contain additives.

The epoxy resin to be used in the present invention has two or more epoxy groups in a molecule. Specific examples thereof include glycidyl ether type epoxy resins (e.g., bisphenol A diglycidyl ether, bisphenol S diglycidyl ether, novolak glycidyl ether and brominated bisphenol A diglycidyl ether); glycidyl ester type epoxy resins (e.g., hexhydrophthalic diglycidyl ester and dimer diglycidyl ester); glycidylamine type epoxy resins (e.g., triglycidylisocyanurate and tetraglycidyldiamino-diphenylmethane) and alicyclic or aliphatic epoxides [e.g., (3',4'-epoxycyclohexylmethyl) 3,4-epoxycyclohexanecarboxylate, epoxidated polybutadiene and epoxidated soybean oil]. These epoxy resins may be used alone or in combination.

The epoxy resin content is adjusted in such a manner that the equivalent ratio of (carboxyl group in polyester polyurethane):(epoxy group in the epoxy resin) of 1:0.5–1:5, preferably 1:1–1:3, is achieved. When the epoxy resin is contained in an equivalent amount of less than 0.5-fold of the carboxyl group content, the crosslinking density becomes small and heat resistance becomes poor, whereas when it is contained in an equivalent amount exceeding 5-fold of the carboxyl group content, the amount of unreacted epoxy group increases to degrade heat resistance.

In the present invention, a catalyst may be used to accelerate the reaction of the epoxy group in the epoxy resin and the carboxyl group in polyester polyurethane. The catalyst is exemplified by basic compounds such as triethylamine, benzyldimethylamine, triphenylphosphine, imidazole compounds and the like.

Adhesive Film

The adhesive film of the present invention can be produced in the same manner as in conventional film production. For example, a solution of a composition containing polyester polyurethane and epoxy resin is coated on a release film so that the adhesive film after drying has a thickness of 10 $\mu$m–60 $\mu$m, preferably 30 $\mu$m–50 $\mu$m. After coating, the film is dried with a hot air and the coating layer is released from the release film to give an adhesive film.

Drying temperature is 80–160° C., preferably 100–120° C., and drying time is 1–10 min, preferably 2–5 min.

The release film is exemplified by polypropylene film, fluorocarbon film, silicon resin film and a film wherein fluorocarbon or silicon resin is laminated as a release layer on a PET film and the like. In view of easy release, fluorocarbon film is preferable.

EXAMPLE

The present invention is described in more detail in the following by way of examples, to which the present invention is not limited. In the following examples, "part" means "part by weight".

Synthetic Example 1 Polyester Polyurethane

In a reaction vessel equipped with a thermometer, a stirrer, a reflux condenser and a distillation tube are charged the constituent components of polyester polyol A [100 parts (before polymerization) inclusive of dicarboxylic acid component and glycol component] shown in Table 1, and toluene (70 parts). After dissolution, toluene (20 parts) was evaporated and the reaction system was dehydrated by azeotropic distillation using toluene/water. The reaction mixture was cooled to 60° C., and 2,2-dimethylolbutanoic acid (DMBA, 9 parts) and ethyl methyl ketone (50 parts) were added. After DMBA was dissolved, hexamethylene diisocyanate (8 parts) and dibutyltin dilaurate (0.4 part, reaction catalyst) were added. The mixture was reacted at 80° C. for 3 hr and ethyl methyl ketone (37.8 parts) and toluene (37.8 parts) were cast therein to adjust the solid concentration to 40%, whereby a solution of polyester polyurethane was obtained.

The properties of the polyester polyurethane are shown in Table 1. The obtained polyester polyurethane solution was dried at 120° C. for 1 hour to give a film without solvent, and the obtained film was determined for the acid value in chloroform by the use of a solution of potassium hydroxide in ethanol. In Table 1, the number average molecular weight was measured by gel permeation chromatography using tetrahydrofuran as a solvent, and the glass transition temperature was measured by a differential scanning calorimeter at a temperature elevation rate of 20° C./min. The properties of the respective polyester polyurethane obtained in Synthetic Examples 2–5 and Comparative Synthetic Examples 1–4 were determined. The obtained results are shown in Tables 1 and 2.

Synthetic Examples 2–5 Polyester Polyurethane

In the same manner as in Synthetic Example 1, polyester polyurethane was obtained from the starting materials shown in Table 1.

Comparative Synthetic Examples 1–4

In the same manner as in Synthetic Example 1, polyester polyurethane was obtained from the starting materials shown in Table 2. In Comparative Synthetic Examples 1 and 2, the obtained polyester polyurethane had an acid value outside the scope of the present invention, and in Comparative Synthetic Examples 3 and 4, the obtained polyester polyurethane had a greater proportion of polyester polyurethane having a molecular weight of not more than 5,000 and they were outside the scope of the present invention.

Example 1

To a 30% solution (100 parts) of polyester polyurethane obtained in Synthetic Example 1 was added 15 parts of o-cresol novolak type epoxy resin YDCN703 (manufactured by Tohto Kasei Company) and the mixture was coated on a polypropylene release film to the thickness (after drying) of 30 μm, which was followed by drying with hot air at 120° C. for 10 min. The coating layer was separated from the polypropylene film to give an adhesive film. Using the obtained adhesive film, a 125 μm thick polyimide film and copper foil were adhered at 140° C. under pressurization (5 kg/cm$^2$) for 1 min. The obtained adhesion sample was heat treated at 150° C. for 3 hr to allow crosslinking. The obtained laminate was evaluated for peel strength at 25° C. and 100° C., peel strength after immersing in warm water at 80° C. for 10 min and heat resistance of solder. The obtained adhesive film was stood at 40° C., 80% RH for 1 month, and polyimide film and copper foil were adhered under the same adhesion conditions. The obtained laminate was evaluated for peel strength and heat resistance of solder in the same manner as above. The results are shown in Table 3. The compositions in Table 3 are in solid weight ratios.

Examples 2–5, Comparative Examples 1–4

The adhesive films having the same compositions shown in Tables 3 and 4 were prepared in the same manner as in Example 1, and subjected to the same determinations as in Example 1. The results are shown in Tables 3 and 4. In all examples, fine properties (adhesive property and heat resistance of solder) were observed, and film properties of the adhesive film after leaving at 40° C., 80% RH for 1 month were also fine.

In contrast, the films of Comparative Examples, particularly those of Comparative Examples 3 and 4, failed to show desired properties, due to the crosslinking occurred in the one month standing at 40° C., 80% RH.

TABLE 1

Compositions and properties of polyester polyurethane resin

| composition-resin property | Synth. Ex. 1 | Synth. Ex. 2 | Synth. Ex. 3 | Synth. Ex. 4 | Synth. Ex. 5 |
|---|---|---|---|---|---|
| polyester polyol | | | | | |
| A | 100 | 50 | | 100 | 50 |
| B | | 50 | 100 | | |
| C | | | | | 50 |
| Chain extender | | | | | |
| DMBA | 9 | 12 | 6 | 9 | 9 |
| Neopentyl glycol | | | | | |
| Organic diisocyanate | | | | | |
| HDI | 8 | 8 | 8 | | |
| MDI | | | | 8 | 19 |
| acid value (eq/ton) | 520 | 700 | 350 | 540 | 550 |
| number average molecular weight (Mn) | 16000 | 17000 | 16000 | 17000 | 21000 |
| Component (wt %) having molecular weight ≦ 5,000 | 5.6 | 7.3 | 10 | 8.9 | 13.5 |
| Glass transition temperature (° C.) | 11 | 17 | 40 | 21 | 28 |

TABLE 2

Compositions and properties of polyester polyurethane resin

| composition-resin property | Comp. Synthetic Ex. 1 | Comp. Synthetic Ex. 2 | Comp. Synthetic Ex. 3 | Comp. Synthetic Ex. 4 |
|---|---|---|---|---|
| polyester polyol | | | | |
| A | 100 | 100 | | 50 |
| B | | | | |
| C | | | 100 | 50 |
| Chain extender | | | | |
| DMBA | | 20 | 9 | 9 |
| Neopentyl glycol | 9 | | | |
| Organic diisocyanate | | | | |
| HDI | 8 | 18 | 12 | |
| MDI | | | | 12 |
| acid value (eq/ton) | 90 | 1090 | 590 | 580 |
| number average molecular weight (Mn) | 14000 | 15000 | 7000 | 12000 |
| Component (wt %) having molecular weight ≦ 5,000 | 6 | 7 | 32 | 25 |
| Glass transition temperature (° C.) | 11 | 18 | 11 | 18 |

The symbols in the Tables 1 and 2 are as defined above.

[Polyester polyol]

polyester polyol A: terephthalic acid/isophthalic acid/adipic acid/anhydrous trimellitic acid//2-methyl-1,3-propanediol/1,4-butanediol (40/35/23/2//50/50 molar ratio, number average molecular weight 15,000, acid value 150 eq/ton)

polyester polyol B: terephthalic acid/isophthalic acid//ethylene glycol/neopentyl glycol (50/50//50/50 molar ratio, number average molecular weight 12,000, acid value 8 eq/ton)

polyester polyol C: terephthalic acid/isophthalic acid/adipic acid/anhydrous trimellitic acid//2-methyl-1,3-propanediol/1,4-butanediol (40/35/23/2//50/50 molar ratio, number average molecular weight 3,000, acid value 150 eq/ton)

The number average molecular weight and acid value in parentheses above are values determined after polymerization of each polyester polyol.

[Chain extender]

DMBA:2,2-dimethylolbutanoic acid

[Organic diisocyanate]

HDI: hexamethylene diisocyanate

MDI: 4,4'-diphenylmethane diisocyanate

TABLE 3

Composition and property of adhesive film

| | Ex. 1 | Ex. 2 | Ex. 3 | Ex. 4 | Ex. 5 |
|---|---|---|---|---|---|
| Composition | | | | | |
| Polyester polyurethane | Synthetic Ex. 1 | Synthetic Ex. 2 | Synthetic Ex. 3 | Synthetic Ex. 4 | Synthetic Ex. 5 |
| Solid weight ratio | 100 | 100 | 100 | 100 | 100 |
| Epoxy resin | YDCN703 | YDCN703 | YDCN703 | YDCN703 | YDCN703 |
| | 15 | 13 | 12 | 12 | 13 |
| Initial stage | | | | | |
| Peel strength (25° C.) | 1350 | 1230 | 1150 | 970 | 1320 |
| Peel strength (100° C.) | 780 | 850 | 1100 | 810 | 1260 |
| Peel strength (after moistening) | 850 | 920 | 1100 | 705 | 735 |
| Heat resistance of solder | ○ | ○ | ○ | ○ | ○~Δ |
| After standing | | | | | |
| Peel strength (25° C.) | 1240 | 1100 | 980 | 890 | 1200 |
| Peel strength (100° C.) | 700 | 780 | 970 | 800 | 1190 |
| Peel strength (after moistening) | 800 | 820 | 980 | 620 | 670 |
| Heat resistance of solder | ○ | ○ | ○ | ○ | Δ |

TABLE 4

Composition and property of adhesive film

| | Com. Ex. 1 | Com. Ex. 2 | Com. Ex. 3 | Com. Ex. 4 |
|---|---|---|---|---|
| Composition | | | | |
| Polyester polyurethane | Com. Synth. Ex. 1 | Com. Synth. Ex. 2 | Com. Synth. Ex. 3 | Com. Synth. Ex. 4 |
| Solid weight ratio | 100 | 100 | 100 | 100 |
| Epoxy resin | YDCN703 | YDCN703 | YDCN703 | YD8125 |
| | 15 | 12 | 14 | 13 |
| Initial stage | | | | |
| Peel strength (25° C.) | 680 | 730 | 780 | 830 |
| Peel strength (100° C.) | 20 | 20 | 240 | 500 |
| Peel strength (after moistening) | 20 | 20 | 20 | 420 |
| Heat resistance of solder | ○~Δ | Δ | Δ~x | Δ~x |
| After standing | | | | |
| Peel strength (25° C.) | 450 | 20 | 40 | 20 |
| Peel strength (100° C.) | 20 | 20 | 20 | 20 |
| Peel strength (after moistening) | 20 | 20 | 20 | 20 |
| Heat resistance of solder | Δ~x | x | x | x |

The symbols in the Tables 3 and 4 are as defined above.

[Epoxy resin]

YD8125: manufactured by Tohto Kasei Company, bisphenol A type epoxy resin, epoxy equivalent 175 g/equivalent YDCN703: manufactured by Tohto Kasei Company o-cresol novolak type epoxy resin, epoxy equivalent 220 g/equivalent Peel Strength A laminate comprising a polyimide film, a copper foil and an adhesive film was determined for peel strength at 25° C. and 100° C. at peel rate of 50 mm/min. The laminate was immersed in warm water at 80° C. for 10 (after moistening) and peel strength was measured in the same manner as above. The unit of the peel strength in the Tables 3 and 4 is g/cm.

Heat Resistance of Solder

A laminate comprising a polyimide film, a copper foil and an adhesive film was determined for blister after standing at 40° C., 80% RH for 24 hr and immersion in a solder bath at 260° C. for 10 seconds. The evaluation criteria were as follows. ○: no abnormality, Δ: partial blister, x: blister in the entirety The adhesive resin composition and the adhesive film obtained therefrom of the present invention comprises polyester polyurethane having a specific acid value and a low content of a low molecular weight resin component. Consequently, the thermoplastic property can be maintained at normal temperature, because it is not cured with an epoxy resin until specific temperature conditions. Thus, the adhesive resin composition and the adhesive film obtained therefrom of the present invention have a longer working life and are superior in adhesive property, heat resistance and water resistance. They are particularly useful as an adhesive for a circuit board.

This application is based on application No. 287112/1997 filed in Japan, the content of which is incorporated hereinto by reference.

What is claimed is:

1. An adhesive resin composition comprising a polyester polyurethane having a number average molecular weight of 8,000–100,000, wherein said polyester polyurethane has a pendent carboxyl group and an epoxy resin having two or more epoxy groups per molecule, said polyester polyurethane having an acid value of 100–1,000 equivalent/$10^6$ g and the proportion of polyester polyurethane having a molecular weight of not more than 5,000 being not more than 20 wt %.

2. The adhesive resin composition of claim 1, wherein the polyester polyurethane comprises a polyester polyol component having a number average molecular weight of 5,000–50,000 in a proportion of not less than 60 wt %.

3. The adhesive resin composition of claim 2, wherein the polyester polyol component comprises a dicarboxylic acid component comprising an aromatic dicarboxylic acid in a proportion of not less than 30 mol %.

4. The adhesive resin composition of claim 1, wherein the polyester polyurethane comprises a polyester polyol comprising, as a constituent component, at least one dicarboxylic acid selected from the group consisting of terephthalic acid, isophthalic acid, phthalic acid, 2,6-naphthalenedicarboxylic acid and adipic acid.

5. The adhesive resin composition of claim 1, wherein the polyester polyurethane comprises a polyester polyol comprising, as a constituent component, at least one glycol selected from the group consisting of ethylene glycol, propylene glycol, 2-methyl-1,3-propanediol, diethylene glycol, neopentyl glycol and 1,4-cyclohexanedimethanol.

6. The adhesive resin composition of claim 1, wherein the polyester polyurethane comprises, as a constituent component, at least one organic diisocyanate selected from the group consisting of 4,4'-diphenylmethane diisocyanate, hexamethylene diisocyanate and isophorone diisocyanate.

7. The adhesive resin composition of claim 1, wherein the equivalent ratio of (the carboxyl group contained in the polyester polyurethane):(the epoxy group contained in the epoxy resin) is 1:0.5–1:5.

8. An adhesive film obtained from the adhesive resin composition of claim 1.

* * * * *